(12) United States Patent
Rutledge

(10) Patent No.: US 9,736,588 B2
(45) Date of Patent: Aug. 15, 2017

(54) DIGITAL SIGNAL ROUTER FOR VEHICLE REPLACEMENT SOUND SYSTEM

(71) Applicant: AUTOMOTIVE DATA SOLUTIONS, INC., Montréal (CA)

(72) Inventor: Mark Rutledge, Murrieta, CA (US)

(73) Assignee: Automotive Data Solutions, Inc., Montreal (CA)

( * ) Notice: Subject to any disclaimer, the term of this patent is extended or adjusted under 35 U.S.C. 154(b) by 0 days.

(21) Appl. No.: 14/942,077

(22) Filed: Nov. 16, 2015

(65) Prior Publication Data

US 2017/0026749 A1    Jan. 26, 2017

Related U.S. Application Data

(60) Provisional application No. 62/196,220, filed on Jul. 23, 2015.

(51) Int. Cl.
  *H04R 3/14* (2006.01)
  *G06F 3/16* (2006.01)
(52) U.S. Cl.
  CPC ............ *H04R 3/14* (2013.01); *G06F 3/165* (2013.01); *H04R 2499/13* (2013.01)
(58) Field of Classification Search
  CPC .......... H04L 47/283; H04R 3/14; G10L 19/26
  USPC .................. 342/357.58; 361/679.01; 381/86; 398/202; 701/1, 36; 704/251; 705/42; 709/203
  See application file for complete search history.

(56) References Cited

U.S. PATENT DOCUMENTS

| 5,790,481 A * | 8/1998 | Meitner | H04B 1/205 340/4.37 |
|---|---|---|---|
| 6,252,771 B1 * | 6/2001 | Jordan | H01L 23/4006 165/80.4 |
| 2005/0134503 A1 * | 6/2005 | Colley | G01S 19/05 342/357.58 |
| 2005/0180763 A1 * | 8/2005 | Jurzitza | H03F 3/08 398/202 |
| 2005/0197775 A1 * | 9/2005 | Smith | G08B 21/10 702/3 |
| 2005/0267647 A1 * | 12/2005 | Kamdar | G06F 17/289 701/1 |
| 2006/0212198 A1 * | 9/2006 | Lueftner | H04L 12/40032 701/36 |
| 2008/0013752 A1 * | 1/2008 | Stephens | H03G 5/005 381/103 |

(Continued)

*Primary Examiner* — Gerald Gauthier
(74) *Attorney, Agent, or Firm* — Trojan Law Offices

(57) ABSTRACT

An aftermarket digital signal router that is installed in a vehicle when a factory loudspeaker system is replaced with an aftermarket loudspeaker system. The digital signal router comprises a first and a second analog signal receiver to receive at least two sources of audio from the vehicle. It also comprises a vehicle data transceiver that receives digital data from the vehicle's data network. It processes audio signals based on the data and status of the vehicle's data network and transmits the processed audio signals to an aftermarket amplifier. In some embodiments, the digital signal router is flashable with different versions of firmware so that it can work with different types of vehicle while transmitting audio that is compatible to most aftermarket amplifiers. The digital signal router is also adapted to handle potential conflict of two audio streams based on the signals of the vehicle's data network.

20 Claims, 4 Drawing Sheets

(56) References Cited

U.S. PATENT DOCUMENTS

| | | | |
|---|---|---|---|
| 2009/0154714 A1* | 6/2009 | Sugawara | H04S 7/305 |
| | | | 381/17 |
| 2010/0125410 A1* | 5/2010 | Hicks | B61L 25/025 |
| | | | 701/533 |
| 2012/0163621 A1* | 6/2012 | Riggs | H03G 3/3005 |
| | | | 381/86 |
| 2013/0197753 A1* | 8/2013 | Daly | G06F 7/00 |
| | | | 701/36 |
| 2015/0098172 A1* | 4/2015 | Kankiewicz | H02J 7/0044 |
| | | | 361/679.01 |
| 2015/0269939 A1* | 9/2015 | Gruchalski | B60R 16/0373 |
| | | | 704/251 |
| 2016/0012411 A1* | 1/2016 | Kursun | G06Q 20/3221 |
| | | | 705/42 |
| 2016/0077789 A1* | 3/2016 | Hampiholi | H04L 65/605 |
| | | | 709/203 |
| 2016/0277302 A1* | 9/2016 | Olsen | H04L 47/283 |
| 2016/0329061 A1* | 11/2016 | Heber | G10L 19/26 |
| 2017/0026749 A1* | 1/2017 | Rutledge | G06F 3/165 |

\* cited by examiner

DIGITAL SIGNAL ROUTER FOR VEHICLE REPLACEMENT SOUND SYSTEM

This application claims priority to United States Provisional Patent Application No. 62/196,220, filed on Jul. 23, 2015.

FIELD OF THE INVENTION

The present invention relates to aftermarket technologies in vehicles. In particular, the present invention relates to vehicle replacement sound systems.

BACKGROUND

In an audio system, before audio signals are converted to the sound being played by loudspeakers, the audio signals are usually processed in different ways, such as undergoing amplifying, equalizing, crossover and other signal processing. This processing can be done in several discrete components, such as an equalizer, a digital signal processor (DSP), and an amplifier, or, alternatively, by an amplifier with equalization and digital signal processing functionality built into it.

For a typical factory sound system in a vehicle, the processing of audio signals is done similarly. However, since the vehicle sound system is responsible for playing not only the sound from the radio but also warning messages and chime sound from the vehicle, the factory amplifier is connected to and controlled by the vehicle data system. The factory amplifier often receives other audio signals such as notifications from a factory GPS navigation system, voice audio from a Bluetooth hands-free phone system, or an external audio device such as a remote mounted CD player or USB media player. In many cases, the amplifier also adjusts the system volume and controls the fader and balance based on data messages sent on the vehicle data network by the factory radio.

Many vehicle owners desire to improve the sound or functionality of the factory audio system. This usually requires replacement of their factory sound components with aftermarket sound components such as amplifiers with more power and higher fidelity, and loudspeakers with more power handling capability and better sound quality. However, in vehicles with amplifiers connected to vehicle data networks, replacing the factory amplifier and the factory loudspeakers is not as simple as removing those components, installing the new ones and reconnecting the wires. This is because the factory amplifier is specifically designed to be more functional and is controlled by a set of data messages sent on the vehicle data network. These messages vary based on the vehicle make, model and audio system. Aftermarket amplifiers are not configured to work with any of the vehicle data networks.

Typically, to work around this issue, the factory amplifier is not replaced when an aftermarket amplifier and speakers are added. Instead, an aftermarket amplifier is added to the system after the factory amplifier and a digital signal processor unit is installed between the factory amplifier and the aftermarket amplifier. Since the outputs of the factory amplifier are band limited and designed to drive the particular factory speakers, it is often necessary to sum several output channels from the factory amplifier to get a full-range input for the aftermarket amplifier from 20 to 20 KHz. The digital signal processor converts the analog audio signals to digital signals and combines several output channels. Then, it is used to invert any equalization and time alignment done by the factory DSP amplifier, and outputs a full spectrum (20 Hz-20 KHz) flat (with no frequency boosted or attenuated) to the aftermarket amplifier to re-process the signals in a way that fits the aftermarket loudspeakers. Once a flat signal is obtained, the DSP unit may re-process the signal for the new system prior to transmitting it to the aftermarket amplifier. Typical re-processing includes providing boost or attenuation of specific frequencies, splitting the signal up for different speakers, and time aligning the signal to perfect the stereo image.

This typical signal re-processing has significant drawbacks. One drawback is that the sound quality is often affected because the audio signals are processed, reverted and processed again before they are played by the loudspeakers. Second, it is often very complex and difficult to reconstruct audio signals that have already been processed by an amplifier. As such, a good DSP unit is often very expensive and is hard to set up properly. Third, such a system often results in warning chimes, voice prompts and Bluetooth telephone audio being louder than they should be or being played in all of the new loudspeakers rather than in specific loudspeakers such as the left front speaker. Fourth, sometimes the factory amplifier processes the audio signals in such a way that it is irreversible, thus preventing the aftermarket sound systems from perfectly reconstructing the ideal audio signals and playing the best quality of sound.

In the alternative, some installers opt to replace the factory amplifier with an aftermarket amplifier to gain access to the full-frequency, flat audio signals provided by the radio to the factory DSP amplifier. However, removing the factory amplifier will deprive the vehicle of much functionality that is handled by the vehicle's data system. Since the factory amplifier is configured to control the main system volume, connecting an aftermarket amplifier to the radio output directly will result in the loss of system volume control. Also, the warning chimes and voice notification from the vehicle will also be lost. In addition, in most cases this will result in the inability to fade the sound from front to rear or balance the sound from left to right in the new system.

SUMMARY OF THE INVENTION

In view of the above-described problems, one objective of the present invention is to provide a solution that can reduce the cost and complexity of sound signal processing in vehicles when a factory sound system is replaced with an aftermarket sound system.

In one aspect, an embodiment of the present invention includes a signal-processing module that connects between the vehicle network and an aftermarket audio amplifier when a factory loudspeaker system is replaced with an aftermarket loudspeaker system. The signal-processing module is referred as a digital signal router. The digital signal router comprises a first analog signal receiver, a second analog signal receiver, a vehicle data transceiver, a microcontroller unit (MCU), a control logic unit, a signal processor, a multi-channel analog audio transmitter, a digital audio transmitter, an analog input-output unit, and an external data input unit. Depending on the aftermarket audio amplifiers that the vehicle owner purchases, the digital signal router is connected either to an aftermarket analog audio amplifier or an aftermarket digital audio amplifier. The amplifier is connected to a plurality of aftermarket loudspeakers. The aftermarket loudspeakers can be any combination of front or rear tweeter, midrange, woofer and subwoofer loudspeakers. There also can be any numbers of aftermarket loudspeakers.

The digital signal router is adapted to receive two different analog audio sources simultaneously. It receives audio signals from the first analog audio output through the first analog signal receiver and receives audio signals from the second analog audio output through the second analog signal receiver. The microcontroller unit of the digital signal router is adapted to control the signal processing and to analyze the digital data being transmitted from the vehicle data network. The microcontroller controls the signal processor to process two incoming audio sources based on the different settings and the digital data detected in the vehicle data network. The digital signal router processes the incoming audio without any equalization or crossover.

In another aspect, a digital signal router in accordance with an embodiment of the present invention is flashable with different firmware so that it can be configured to work with different vehicles. The digital signal router contains in its memory a piece of encryption data so that firmware can be transmitted from a data source in a safe and encrypted manner. The digital signal router may work with different vehicles because the digital signal router may be re-flashed with different firmware that is compatible with different vehicles. It has the capability to receive many different types and values of input signals from different potential vehicles while it outputs audio signals that are almost universal and compatible to all aftermarket audio amplifiers that are available on the market.

In yet another aspect, a digital signal router in accordance with an embodiment of the present invention is adapted to handle routing of two potentially conflicting audio sources based on the information on the vehicle data network. The digital signal router can continuously receive a first source of audio and await the vehicle data network for a signal that signifies an incoming of a second source of audio. When a second source of audio is detected, the digital signal router processes both streams of audio based on the data from the vehicle data network. Potential processing routines include muting of one source, fading of one source, superposing both sources.

DETAILED DESCRIPTION OF EMBODIMENTS

The following description is made for the purpose of illustrating the general principles of the invention and should not be taken in a limiting sense. The scope of the invention is best determined by reference to the appended claims.

The invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art.

Exemplary embodiments of the present invention are described herein with reference to idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing.

Figure 1:
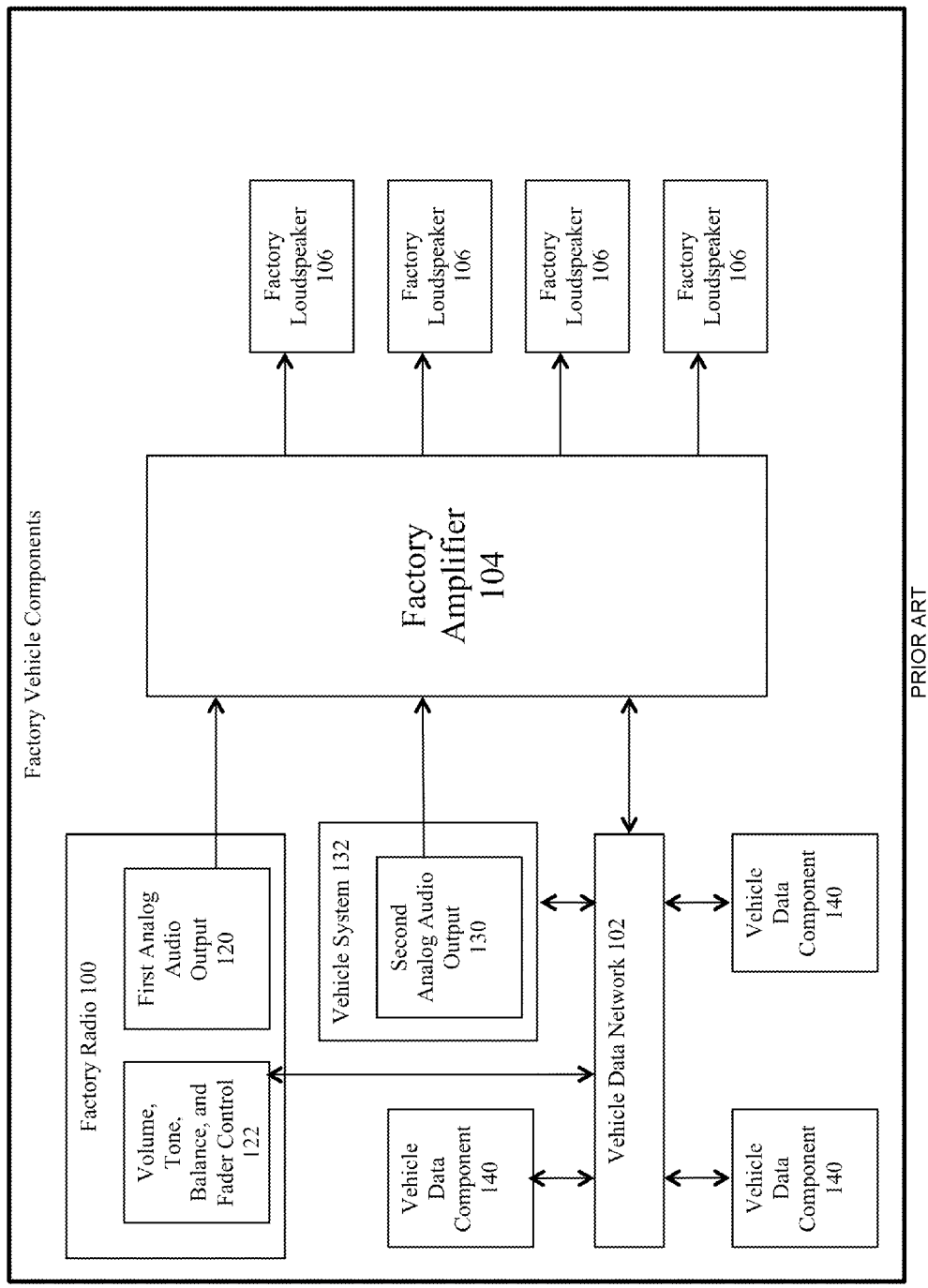
FIG. 1 is a representative schematic view of a vehicle factory sound system and data network.

FIG. 1 is a schematic representation of a factory vehicle sound system before the system is replaced by any aftermarket units. The factory sound system at least comprises a factory radio 100, a vehicle data network 102, a factory amplifier 104, and a plurality of factory loudspeakers 106. The vehicle data network 102 is often a vehicle data bus such as a controller area network (CAN) that allows different vehicle data components of the vehicle to communicate with each other.

The factory radio 100 further comprises volume, tone, balance and fader controls 122 and at least a first audio output 120. The first audio output 120 transmits audio signals that are being played by the factory radio 100 such as music being played by a CD player. The volume, tone, balance, and fader controls 122 allow users to adjust the properties of the sound such as its volume level. When settings are changed, the controls 122 transmit control signals to the vehicle data network 102 to indicate the change in settings. However, in a common configuration of a typical vehicle, the first analog audio output is not directly responsive to these changes. Instead, the factory amplifier 104 processes the audio signals based on the control signals sent from the controls 122 via the vehicle data network 102. The factory amplifier 104 is connected to the first audio output 120 and also in in communication of the vehicle data network 102. The factory amplifier 104 processes any incoming audio signals based on the configuration of the factory loudspeakers 106 and based on the control signals sent from the controls 122 via the vehicle data network 102.

Additionally, a vehicle is usually equipped with a second analog audio output 130. The second analog audio output 130 is usually the output source of the vehicle's voice controls and warning signals. For example, the second analog audio output 130 could be an output for the vehicle chime or for the vehicle's factory GPS system that transmits notifications and warnings. The second analog audio output 130 could be a part of a separate vehicle system 132 or a part of the factory radio 100 as the second output source of the factory radio 100. The exact configuration depends on the model and the make of the vehicle. Regardless whether the second analog audio output 130 belongs to a separate unit 132 or is a part of the factory radio 100, the second analog audio output 130 is connected to the factory amplifier 104 and the vehicle system 132 is also connected to and in communication with the vehicle data network 102.

Figure 2:
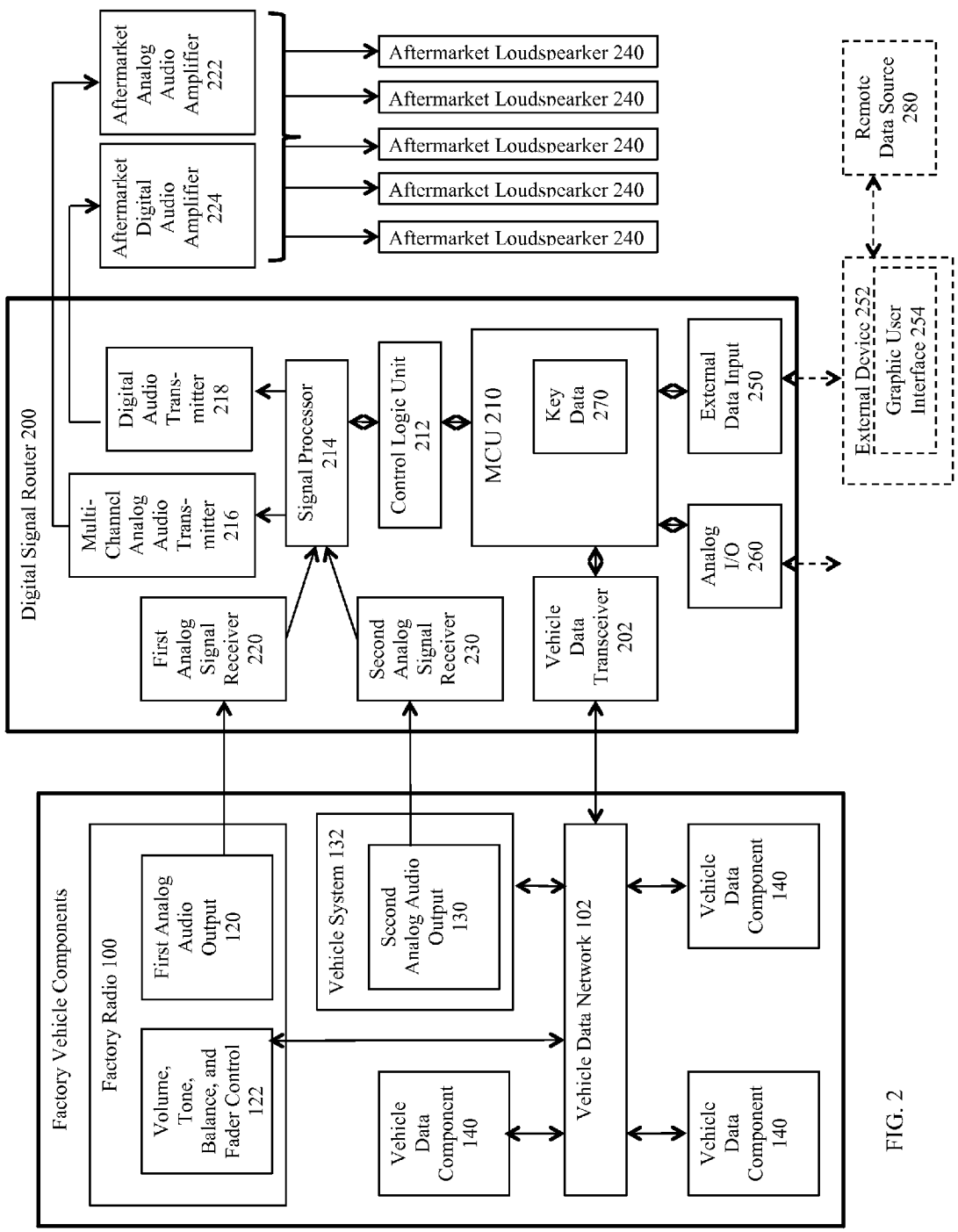
FIG. 2 is a representative schematic view of an aftermarket sound system that utilizes a digital signal router in accordance with an embodiment of the present invention.

Now referring to FIG. 2, it is a schematic representation an aftermarket sound system with the use of an aftermarket signal-processing module called a digital signal router 200 in accordance with an embodiment of the present invention. The vehicle components remain largely the same as those shown in FIG. 1. The factory vehicle components still comprises a factory radio 100 that contains volume, tone, balance, fader controls 122 and a first analog audio output 120, a second analog audio output 130, and a vehicle data network 102 that is in communications with the factory radio 100, the vehicle system 132, and a plurality of other vehicle data components 140. However, the factory amplifier 104 has been removed from the vehicle.

In accordance with an embodiment of the present invention, the digital signal router 200 comprises a first analog signal receiver 220, a second analog signal receiver 230, a vehicle data transceiver 202, a microcontroller unit (MCU) 210, a control logic unit 212, a signal processor 214, a multi-channel analog audio transmitter 216, a digital audio transmitter 218, an analog input-output unit 260, and an external data input unit 250. Depending on the aftermarket audio amplifier that the vehicle owner purchases, the digital signal router 200 is connected either to an aftermarket analog audio amplifier 222 or an aftermarket digital audio amplifier 224. The amplifier 222 or 224 is connected to a plurality of aftermarket loudspeakers 240. The aftermarket loudspeakers 240 can be any combination of front or rear tweeter, midrange, woofer and subwoofer loudspeakers. There also can be any numbers of aftermarket loudspeakers 240.

The digital signal router 200 receives audio signals from the vehicle through one or more analog signal receivers 220 and 230 and receives digital data from the vehicle data network 102 through a vehicle data transceiver 202. In the particular embodiment shown in FIG. 2, the digital signal router 200 is adapted to receive two different analog audio sources simultaneously. It receives audio signals from the first analog audio output 120 through the first analog signal receiver 220 and receives audio signals from the second analog audio output 120 through the second analog signal receiver 230. For example, if the first analog audio output 120 is the audio output of a CD player of the factory radio 100 while the second analog audio output 130 is the audio output of a phone system of the vehicle, the digital signal router 200 will be capable of receiving both types of audio signals using two different analog signal receivers 220 and 230 simultaneously. As to any digital data being transmitted from the vehicle data network 102, the vehicle data transceiver 202 is adapted to communicate with the vehicle data network 102 to transmit data to and from between the vehicle data network 102 and the microcontroller unit 210.

The microcontroller unit 210 is adapted to control the signal processing and to analyze the digital data being transmitted from the vehicle data network 102. In a preferred embodiment, the microcontroller unit 210 is flashable remotely in a manner that will be discussed in further detail below. After the microcontroller unit 210 is flashed and configured properly with a particular vehicle, the microcontroller unit 210 is loaded with algorithm, instructions, and data to decode and analyze any incoming digital data from the vehicle data network 102 and control the signal processing of the signal processor 214. The microcontroller unit 210 transmits instructions to a control logic unit 212 that is adapted to control the routine of the signal processor 214.

The signal processor 214 can be a digital signal processor (DSP), an analog signal router with gain, or any combination of both. Those skilled in the art will understand that the exact configuration and the type of signal processor 214 will depend on the audio signals that the signal processor 214 needs to process. The signal processor 214 is configured with different predetermined routines to process the incoming audio signals differently. The control logic unit 212 controls and selects the routines that the signal processor 214 will use for processing incoming audio signals. Predetermined routines could include increasing the gain, fading, muting, analog to digital, digital to analog, separating channel, completely delaying channels, and/or partially delaying channels, etc. Those skilled in the art will understand that other signal processing routines are also possible. However, it is noteworthy that the signal processor 214 can be simple and inexpensive since it does not need to carry out signal summing or de-equalization in order to preserve the quality of the audio signals because the input signals from the factory radio 100 are already ideal and unprocessed.

The functionality of the digital signal router 200 may depend on the choice of the aftermarket amplifier 222 or 224 and the preference of the vehicle owner. Those skilled in the art will understand that the digital signal router 200 is universal and can work with many different types of aftermarket amplifiers that have different features and capacities. Given the wide range of choices of available aftermarket amplifiers on the market, the vehicle owners do not have to be limited to certain brands or models of aftermarket amplifiers or loudspeakers when they choose to use the digital signal router 200. The digital signal router 200 can process signals differently based on the specification of the aftermarket amplifier 222 or 224.

For example, in one embodiment, the vehicle owner prefers to have a rather inexpensive aftermarket power amplifier 222 that simply provides gains to the audio signals. The aftermarket amplifier 222 is connected to multiple aftermarket loudspeakers 240, which include tweeters, woofers and subwoofers. In this situation, since the digital signal router 200 receives unprocessed audio signals from the vehicle, the microcontroller unit 210 controls the signal processor 214 to process the audio signals in a manner that will fit the rather simple aftermarket power amplifier 222. The signal processor 214 will carry out crossover and equalization and split the signals into multiple channels. Then each channel of audio signal will be transmitted to the aftermarket amplifier 222 for power amplification via the multi-channel analog audio transmitter 216.

In another embodiment, the vehicle owner desires to have a high-performance integrated amplifier as the aftermarket amplifier 222 or 224. The integrated amplifier may contain an equalizer and a crossover unit. In this situation, the digital signal router 200 may not need to carry out additional equalization or crossover. Hence, it will send the audio signals in full sound spectrum to the integrated amplifier for the amplifier to carry out equalization and crossover.

Given a wide variety of available amplifiers on the market, the digital signal router 200 is fully customizable with different versions of firmware stored in the microcontroller unit 210 in a manner that will be discussed in further detail below.

After the signal processor 214 processes the audio signals, the audio signals are sent to a multi-channel analog audio transmitter 216 or a digital audio transmitter 218 to be transmitted to aftermarket audio amplifier 222 or 224.

Still referring to FIG. 2 and focusing on the microcontroller unit 210 in accordance with an embodiment of present invention, the microcontroller unit 210 is adapted to be remotely flashable to be loaded with different programs for different vehicles. The microcontroller unit 210 may communicate with an external device 252 through the external data input unit 250. The external data input unit 250 is adapted to communicate with the external device 252 using any computer transfer protocol such as Wi-Fi, Bluetooth, and/or USB. The external device 252 could be any electronics device such as a computer, a tablet, or a mobile phone. The external device 252 is also in communication with a remote data source 280, usually via the Internet. The remote data source 280 could be a server of the manufacturer of the digital signal router 200, any cloud-based data source, or an XML file.

The digital signal router 200 is adapted to be remotely flashed with different firmware and be remotely optimized. When the digital signal router 200 is connected to an external device 252, users or installers of the digital signal router 200 may specify their vehicles' year, make, model, and trim using a graphical user interface 254 of the external device 252 and communicate such vehicle information to the remote data source 280. They may also specify the functionality of the aftermarket amplifier 222 or 224 and the specification of the aftermarket loudspeakers 240 that they choose. The digital signal router 200 will be flashed with a particular firmware that is compatible to the particular vehicle, the aftermarket amplifier and the aftermarket loudspeakers in a manner that is discussed in further detail immediately below.

The microcontroller unit 210 comprises instructions that include a security mechanism and a key data 270. To flash the microcontroller unit 210, a user first uses the graphical user interface 254 to identify his vehicle and makes potential customization of the setting of the digital signal router 200. For example, the user may specify the desirable frequency range for each of the aftermarket loudspeaker 240 so that the firmware will contain information for the digital signal router 200 to preform crossover based on the user's selected specification. After all selections and customizations are made, flashing of the microcontroller unit 210 may begin.

In response to a request to flash the digital signal router 200 from the graphical user interface 254, the external device 252 sends a request signal to the microcontroller unit 210 through the external data input unit 250. In turn, the microcontroller 210 sends the key data 270, usually encrypted, to the external device 252. Then the external device 252 transmits the key data 270 along with a request for a particular firmware that is compatible to a particular vehicle to the remote data source 260 via the Internet. The remote data source 250 is adapted to extract a key or encryption information from the key data and authenticate the key or the encryption information. Upon proper authentication, the remote data source 250 will generate an appropriate encrypted firmware. The encrypted firmware will first be downloaded to the external device 252 via the Internet and then transferred to the microcontroller unit 210 via any computer transfer protocol such as Wi-Fi, Bluetooth, and/or USB. After the transfer of the encrypted firmware to the microcontroller unit 210 is complete, the microcontroller unit 210 subsequently uses the security mechanism and the key data 270 to decrypt the firmware and install the firmware. The flashing is complete as a result.

The digital signal router 200 may work with different vehicles, aftermarket amplifiers, and aftermarket loudspeakers because the digital signal router 200 may be re-flashed with different firmware that is compatible with different vehicles, amplifiers and loudspeakers using the method as described above. The digital signal router 200 has the capability to receive many different types and values of input signals from different potential vehicles while it outputs audio signals that are universal and compatible to different aftermarket audio amplifiers. This avoids the complication of having to install an aftermarket DSP to reconstruct the audio signals.

The digital signal router 200 may or may not be pre-flashed with firmware when it is first sold. Regardless, after the digital signal router 200 is flashed by the manner discussed above, it becomes compatible with the particular vehicle in which it is installed. The microcontroller 210 is now adapted to decode any incoming vehicle data from the vehicle data network 102 and is also adapted to generate and transmit compatible vehicle signals to different vehicle data components 140 via the vehicle data network 102. The decoding is usually achieved by having predetermined and sampled data stored as part of the flashed firmware. If an incoming vehicle data from the vehicle data network 102 matches any sampled data stored in the flashed firmware, the flashed firmware will recognize the incoming vehicle data and determine whether responses are needed and what responses are needed based on the flashed firmware's algorithm. Depending on this determination, the microcontroller unit 210 will respond accordingly.

If the incoming vehicle data from the vehicle data network 102 transmits a command related to the analog audio outputs 120 or 130 and the microcontroller unit 210 successfully recognizes such command, the microcontroller unit 210 will direct the control logic unit 212 to control the signal processor 214 to process the incoming analog audio signals based on the incoming vehicle data. For example, if a volume-reduction command is input by a driver using the volume, tone, balance, and fader controls 122, a vehicle data that represents the volume-reduction command will be sent to the vehicle data network 102 and be detected and decoded by the microcontroller unit 210. In turn, the microcontroller unit 210 will communicate to the control logic unit 212 to select a routine of the signal processor 214 that reduces the magnitude of the audio signals transmitted from the first analog signal receiver 220.

In another embodiment, a vehicle owner re-centers the sound system to converge the sound to the driver seat instead of to the center of the car as in default. The owner makes such adjustment using the vehicle's electronic selection system, which could be one of the vehicle data components 140 as shown in FIG. 2. Then, based on the owner's adjustment, information signals representing such adjustment are sent to the digital signal router 200 via the vehicle data network 102. The signal processor 214 performs crossover to split the audio signal sent from the first analog signal receiver 220 into multiple channels, each of which corresponds to an aftermarket loudspeaker 240. When the signal processor 214 performs crossover, it also adjusts the timing of each channel of audio based on the information signals that represents the owner's adjustment. The time alignment is achieved by delaying certain audio channels in small durations. For example, in this situation where the owner re-centers the sound to the driver seat, the channel of audio that goes to the tweeter 240 located at left-front of the vehicle will be slightly delayed in compared to the channel that goes to the tweeter 240 located at right-front of the vehicle and the channel that goes to the subwoofer 240 located at the back of the driver seat. As such, while the sound will be played at slightly different time at different aftermarket loudspeakers 240, the sound will arrive the driver seat at the same time because the sound played at the loudspeakers 240 that are closer to the driver seat are delayed. After such time alignment is made, the processed signals are transmitted to the aftermarket amplifier 222 through the multi-channel analog audio transmitter 216.

In yet another embodiment, the audio that will be played is the voice of a phone call from the vehicle's Bluetooth system 140. The signal processor 214, being controlled by the microcontroller unit 210, again will process the voice from the phone call based on the digital signals being transmitted in the vehicle data network 102. When a phone call is incoming and the driver decides to pick up the call, the vehicle's Bluetooth system 140 will transmit a signal to the vehicle data network 102 to signify such event. The microcontroller unit 210 detects such signal and directs the signal processor 214 to process the voice. The voice will be processed in a manner that it will only be sent to the front-right aftermarket loudspeaker 240 so that the driver can hear the voice more clearly.

In some situations, the vehicle data network 102 transmits a vehicle data that requires the microcontroller unit 210 to respond but does not affect the audio system of the vehicle. In these situations, the microcontroller unit 210 will process the incoming vehicle data and transmit responses directly back to the vehicle data network 102 via the vehicle data transceiver 202.

The digital signal router 200 processes the incoming audio signals sent from different analog audio sources such as 120 and 130 according to different vehicle data present in the vehicle data network 102. Meanwhile, it directly receives unprocessed audio signals from the vehicle without going through the factory amplifier, which has been removed from the vehicle. Hence, no audio signal reconstruction or de-equalization is required using the digital signal router 200.

In a preferred embodiment, the digital signal router 200 also comprises an analog input and output unit 260. This allows some other additional connections between the vehicle and the digital signal router 200 or between the digital signal router 200 and the aftermarket amplifier 222 or 224. As such, the digital signal router 200 is capable of turning on the aftermarket amplifier 222 or 224 whenever the factory radio 100 is on. This is achieved by connecting an audio wire to the factory radio 100 via the analog input and output port 260 to detect the activity of the factory radio 100.

Figure 3:
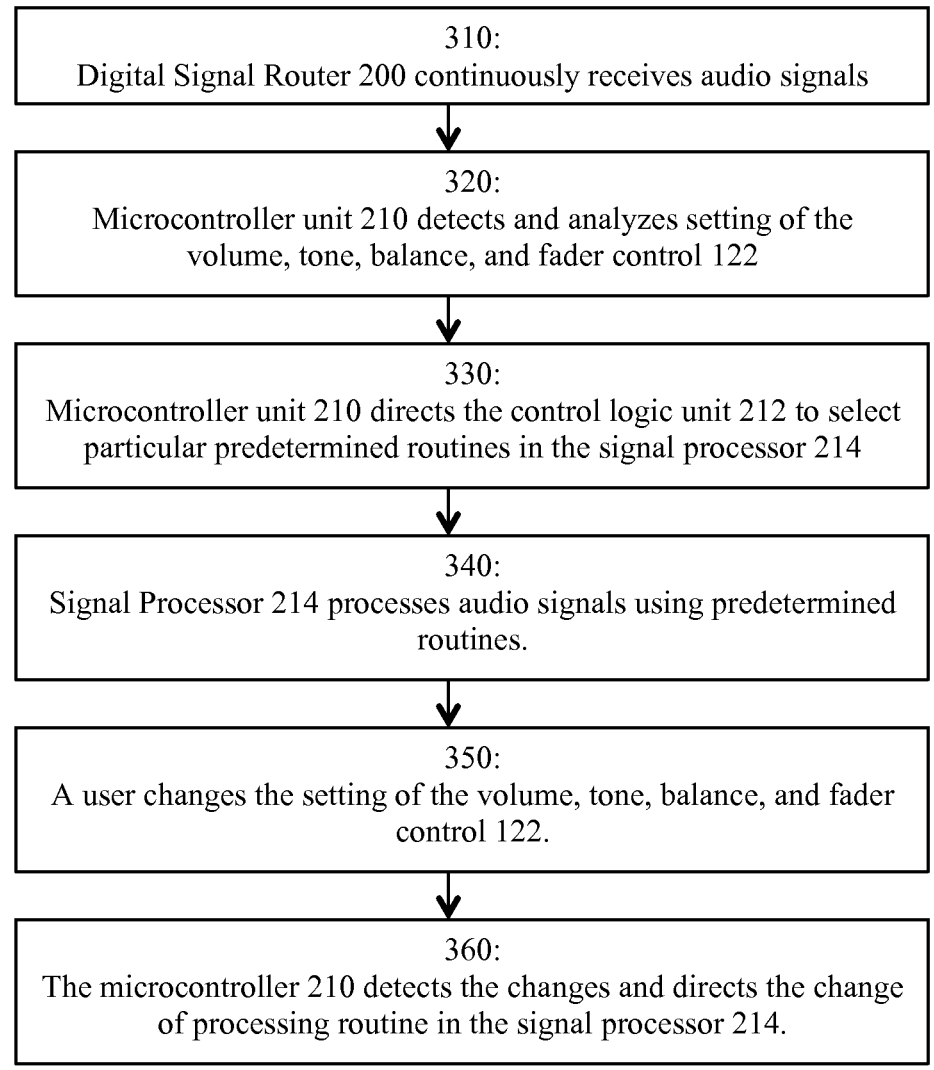
FIG. 3 is a representative block diagram illustrating how a digital signal router controls the sound properties of incoming audio signals in accordance with an embodiment of the present invention.

FIG. 3 is a block diagram that illustrates how a digital signal router 200 controls the sound properties of the music being played by a CD player based on the user's volume, tone, balance and fader settings in accordance with an embodiment of the present invention. In this particular embodiment, the first analog audio output 120 is the audio output of a CD player located in the factory radio 100. At step 310, the digital signal router 200 continuously receives analog audio signals from the first analog audio output 120. At step 320, the microcontroller unit 210 detects and analyzes the digital setting of the volume, tone, balance, and fader controls 122 that is available on the vehicle data network 102. After analyzing the setting, at step 330 the microcontroller unit 210 directs the control logic unit 212 to select particular predetermined routines in the signal processor 214. At step 340, the signal processor 214 continuously processes the audio signals coming from first analog signal receiver 220 and transmits the processed audio signals to the aftermarket audio amplifier 222 or 224. At step 350, a user changes the setting of the volume, tone, balance, and fader controls 122. The microcontroller 210 detects the changes at step 360 and directs the change of processing routines in the signal processor 214. As such, change of the audio properties, such as volume, is achieved using the digital signal router 200. The aftermarket amplifier 222 or 224, which does not have the change of volume feature, will still play the audios in different volumes.

Figure 4:
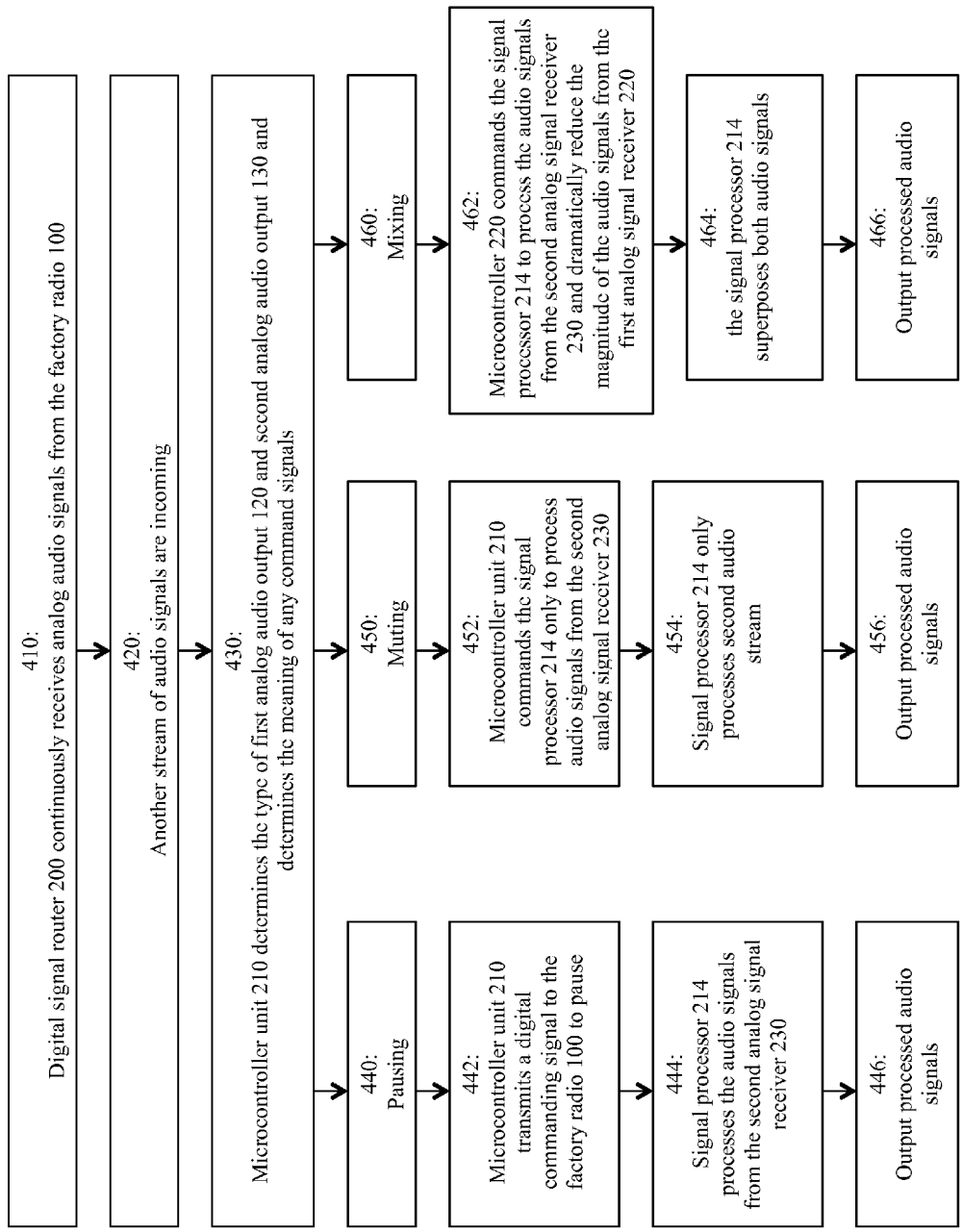
FIG. 4 is a representative block diagram illustrating how a digital signal router controls a potential conflict of two different streams of incoming audio in accordance with different embodiments of the present invention.

FIG. 4 illustrates how the digital signal router 200 is adapted to manage at least two different incoming audio signal sources in accordance with an embodiment of the present invention. In this particular embodiment, the first analog audio output 120 can be, for example, an audio output of the factory radio 100 that is playing a radio channel or a CD player that is playing music. At step 410, the digital signal router 200 continuously receives analog audio signals from the factory radio 100 and continues to await and detect whether there is any incoming signals from the vehicle data network 102. At step 420, the microcontroller 210 receives a signal from the vehicle data network 102. The signal indicates that another stream of audio signals are about to be sent from the second analog audio output 130 and will potentially create a conflict between the first audio stream and the second audio stream. At step 430, the microcontroller unit 210 determines the type of second analog audio output 130 and the meaning of other incoming command signals, if any, based on the information on the vehicle data network 102. Depending on this determination, the routing of audio streams is handled differently, as discussed in further details below.

Oftentimes the vehicle data network 102 is connected to and in communication with more than one vehicle data components 140. The vehicle data components 140 or the vehicle system 132 could be any electronics or telematics components such as engine control unit, transmission control, cruise control, alarm, Bluetooth phone system, GPS navigation system, and other vehicles systems.

Still referring to FIG. 4, in one scenario, the vehicle system 132 that contains the second analog audio output 130 is a Bluetooth phone pairing system in the vehicle that has paired with the driver's mobile phone. At step 420, a call is incoming and the driver has decided to pick up the call while the CD player of the factory radio 100 is playing music. At step 430, the microcontroller unit 210 determines that the second audio stream is going to be an incoming call and the first audio stream is from a CD player. At step 440, based on the algorithm of the microcontroller's firmware, the microcontroller unit 210 determines that pausing the CD player is the optimal response in this situation. In turn, at step 442, the microcontroller unit 210 transmits a digital commanding signal to the factory radio 100 via the vehicle data transceiver 202 and the vehicle data network 102 to pause the CD player inside the factory radio 100. At step 444, the microcontroller 220 commands the signal processor 214 to process the audio signals from the second analog signal receiver 230 and, at step 446, output such audio signals to the front channels of analog audio transmitter 216. As such, the voice of the phone call will be played at the front-end aftermarket loudspeakers 240.

In a second scenario, the second incoming audio is also an incoming call but the first continuous audio stream is from a radio channel of the factory radio 100 instead of from a CD player. As pausing of an ongoing radio channel is not possible, at step 450 the microcontroller unit 210 determines that muting the radio channel is the optimal response. At step 452, the microcontroller 220 commands the signal processor 214 to process the audio signals from the second analog signal receiver 230 and to mute the audio signals from the first analog signal receiver 220. As such, at step 454 only the voice from the call will be transmitted to the aftermarket amplifiers 222 or 224. Typically this audio might be only processed in particular speakers, such as the left-front speaker in this case.

In a third scenario, the vehicle system 132 that contains the second analog audio output 130 is a factory GPS navigation system that provides driving direction to the driver. Meanwhile, the digital signal router 200 is continuously receiving audio streams from a CD player of factory radio 100 via the first analog audio output 120. At step 420, the GPS navigation system is about to provide an audio instruction to the driver. At step 430, the microcontroller unit 210 determines that the second audio stream is going to be an audio instruction from a GPS navigation system and the first audio stream is from a CD player. As such, at step 460, the microcontroller unit 210 determines that mixing the audio, instead of pausing, the music of the CD player is the optimal response. In turn, at step 462, the microcontroller 220 commands the signal processor 214 to process the audio signals from both analog signal receivers 220 and 230 but dramatically reduce the magnitude of the audio signals from the first analog signal receiver 220. Then at step 464 the signal processor 214 superposes both audio signals and, at step 466, transmits the resulted audio to the aftermarket amplifier 222 or 224. As such, the driver will continue to hear the music, but it will be in a much lower volume when the direction instruction from the GPS navigation system is being played. In an alternative situation, the audio instructions from the vehicle GPS navigation system are transmitted as digital audios. In this case, the GPS navigation system will send the digital audios via the vehicle data network 102 instead of via the second analog audio output 130. The microcontroller 210 will process the digital audios in a similar fashion and direct the signal processor 214 superposes the faded audio signals from the first analog signal receiver 220 with the direction instructions from the vehicle data network 102.

While only several scenarios are discussed above, those skilled in art will understand the scenarios discussed are not meant to be exhaustive. Many different scenarios and configurations to process different incoming audio streams are possible using the digital signal router 200.

Those of skill would further appreciate that the various illustrative logical blocks, configurations, modules, circuits, and algorithm steps described in connection with the embodiments disclosed herein may be implemented as electronic hardware, computer software, or combinations of both. To clearly illustrate this interchangeability of hardware and software, various illustrative components, blocks, configurations, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The foregoing description of the embodiments of the present invention has been presented for the purpose of illustration and description. It is not intended to be exhaustive or to limit the invention to the precise form disclosed. Many modifications and variations are possible in light of the above teachings. The numerical values described in the description are only for illustration purpose and should not be understood as limiting the invention to the precise numbers. It is intended that the scope of the present invention not be limited by this detailed description, but by the claims and the equivalents to the claims appended hereto.

What is claimed is:

1. An aftermarket electronic module to be installed in a vehicle that has a factory amplifier removed, comprising:
    a first analog signal receiver connected to a first analog audio output of the vehicle to receive a first source of audio from the vehicle, wherein the first analog signal receiver is connected to the first source of audio in place of being connected to the factory amplifier;
    a second analog signal receiver is connected to a second analog audio output of the vehicle to receive a second source of audio from the vehicle, wherein the second analog signal receiver is connected to the second source of audio in place of being connected to the factory amplifier;
    a vehicle data transceiver connected to a vehicle data network of the vehicle to receive digital signals from the vehicle data network;
    a signal processor connected to the first analog signal receiver and to the second analog signal receiver; the signal processor adapted to process the first source of audio from the first analog signal receiver and to process the second source of audio from the second analog signal receiver;
    a central processor connected to the vehicle data transceiver and the signal processor; the central processor adapted to analyze the digital signals from the vehicle data network and to control the signal processor to process audio based on the digital signals from the vehicle data network, wherein the central processor is capable of being flashed with different versions of firmware sent from a remote data source, each version of firmware compatible to a particular type of vehicle; and
    an audio transmitter adapted to send processed audio from the signal processor to an aftermarket amplifier.

2. The aftermarket electronic module of claim 1, wherein the signal processor is adapted to process audio without undergoing crossover.

3. The aftermarket electronic module of claim 1, wherein the signal processor is adapted to process audio without undergoing equalization.

4. The aftermarket electronic module of claim 1, wherein the signal processor is a digital signal processor.

5. The aftermarket electronic module of claim 1 further comprises an analog input-output unit to be connected to a factory radio of the vehicle to detect the activity of the factory radio.

6. The aftermarket electronic module of claim 1 further comprises an external data input to be connected to an external device that is adapted to be in communication with the remote data source, and wherein the central processor is capable of being flashed with different versions of firmware sent to the remote data source, each version of firmware compatible to a particular type of amplifier.

7. The aftermarket electronic module of claim 6 further comprises a key data that contains encryption information that is associated with an encryption of the firmware sent from the remote data source.

8. An aftermarket electronic module to be installed in a vehicle that has a factory amplifier removed, wherein the module is adapted to:
    receive a first source of audio and to receive a second source of audio, wherein the first source of audio and the second source of audio are received from a non-factory amplifier;
    receive digital signals from a vehicle data network, wherein the digital signals are not passed through a factory amplifier;
    process the first source of audio based on the digital signals from the vehicle data network to result in a first processed result;
    process the second source of audio based on the digital signals from the vehicle data network to result in a second processed result;
    send an output audio that is based on a combination of the first processed result and the second processed result to an aftermarket amplifier.

9. The aftermarket electronic module of claim 8, wherein the module is adapted to process the first source of audio and the second source of audio without undergoing crossover.

10. The aftermarket electronic module of claim 8, wherein the module is adapted to process the first source of audio and the second source of audio without undergoing equalization.

11. The aftermarket electronic module of claim 8, wherein the first source of audio comes from a music player, and wherein the module is adapted to send a command signal to the vehicle data network to cause the music player to pause after the module receives a particular digital signal from the vehicle data network that signifies an incoming of the second source of audio.

12. The aftermarket electronic module of claim 8, wherein the module is adapted to mute the first source of audio after the module receives a particular digital signal from the vehicle data network that signifies an incoming of the second source of audio.

13. The aftermarket electronic module of claim 8, wherein the module is adapted to mute the first source of audio after the module receives a particular digital signal from the vehicle data network that signifies an incoming of the second source of audio.

14. The aftermarket electronic module of claim 8, wherein the module is adapted to fade the first source of audio after the module receives a particular digital signal from the vehicle data network that signifies an incoming of the second source of audio.

15. The aftermarket electronic module of claim 14, wherein the module is adapted to superpose the faded first source of audio and the incoming second source of audio and send the superposed audio to the aftermarket amplifier.

16. An electronic system for a vehicle that has a factory amplifier removed and a factory loudspeaker system replaced with an aftermarket loudspeaker system, the electronic system comprising:
   a first analog audio output from the vehicle;
   a second analog audio output from the vehicle;
   a vehicle data network from the vehicle;
   a central processor adapted to analyze digital signals from the vehicle data network, wherein the central processor is capable of being flashed with different versions of firmware sent from a remote data source, each version of firmware compatible to a particular type of vehicle;
   a signal processor controlled by the central processor; the signal processor processes a first source of audio from the first analog audio output and processes a second source of audio from the second analog audio output;
   a transmitter connected between the signal processor and an aftermarket amplifier; the transmitter adapted to send processed audio signals from the signal processor to the aftermarket amplifier; and
   the aftermarket loudspeaker system connected to the aftermarket amplifier.

17. The electronic system of claim 16, wherein the signal processor processes the audio sources without undergoing crossover or equalization; and wherein the aftermarket amplifier carries out crossover and equalization of the audio signals sent from the transmitter.

18. The electronic system of claim 16, wherein the first analog audio output comes from a factory radio of the vehicle and the second analog audio output transmits the vehicle's warning signals.

19. The electronic system of claim 16, wherein the central processor is adapted to control the signal processor to process the first source of audio based on a particular digital signal from the vehicle data network that signifies an incoming of the second source of audio.

20. The electronic system of claim 16, wherein the first analog audio output comes from a music player, and wherein the central processor is adapted to send a command signal to the vehicle data network to cause the music player to pause after the module receives a particular digital signal from the vehicle data network that signifies an incoming of the second source of audio.

* * * * *